(12) United States Patent
Poon

(10) Patent No.: US 9,655,252 B2
(45) Date of Patent: May 16, 2017

(54) LOW HAZE TRANSPARENT CONDUCTIVE ELECTRODES AND METHOD OF MAKING THE SAME

(71) Applicant: SUZHOU NUOFEI NANO SCIENCE AND TECHNOLOGY CO., LTD., Suzhou Jiangsu (CN)

(72) Inventor: Hakfei Poon, Mountain View, CA (US)

(73) Assignee: SUZHOU NUOFEI NANO SCIENCE AND TECHNOLOGY CO., LTD., Suzhou Jiangsu (CN)

( * ) Notice: Subject to any disclaimer, the term of this patent is extended or adjusted under 35 U.S.C. 154(b) by 0 days.

(21) Appl. No.: 13/906,322

(22) Filed: May 30, 2013

(65) Prior Publication Data

US 2013/0323478 A1 Dec. 5, 2013

Related U.S. Application Data

(60) Provisional application No. 61/654,408, filed on Jun. 1, 2012, provisional application No. 61/654,098, filed on Jun. 1, 2012, provisional application No. 61/802,496, filed on Mar. 16, 2013.

(51) Int. Cl.
| | |
|---|---|
| *H01B 1/22* | (2006.01) |
| *H05K 3/12* | (2006.01) |
| *H05K 1/02* | (2006.01) |
| *H01M 4/38* | (2006.01) |
| *B32B 7/00* | (2006.01) |
| *H05K 1/09* | (2006.01) |
| *B82Y 99/00* | (2011.01) |

(Continued)

(52) U.S. Cl.
CPC ............. *H05K 3/125* (2013.01); *B32B 7/00* (2013.01); *H01B 1/22* (2013.01); *H01M 4/38* (2013.01); *H05K 1/0296* (2013.01); *H05K 1/09* (2013.01); *H05K 3/12* (2013.01); *H05K 3/1283* (2013.01); *B82Y 30/00* (2013.01); *B82Y 40/00* (2013.01); *B82Y 99/00* (2013.01); *H05K 2201/0108* (2013.01); *H05K 2201/026* (2013.01); *H05K 2203/0315* (2013.01); *H05K 2203/125* (2013.01); *Y10T 428/24917* (2015.01); *Y10T 428/24942* (2015.01)

(58) Field of Classification Search
CPC ......... B82Y 30/00; B82Y 10/00; B82Y 40/00; B22F 1/00; B22F 2001/0029; H01L 51/102; H01L 29/0669; H01L 29/413; G02F 1/13338; G02F 2202/36; H05K 2201/026; H05K 1/095; H05K 9/009; H05K 2201/0257; H05K 2201/0209
USPC ......................................... 977/762, 778, 780
See application file for complete search history.

(56) References Cited

U.S. PATENT DOCUMENTS

| | | |
|---|---|---|
| 8,018,568 B2 | 9/2011 | Allemand et al. |
| 8,049,333 B2 | 11/2011 | Alden et al. |
| 8,094,247 B2 | 1/2012 | Allemand et al. |

(Continued)

*Primary Examiner* — Jeremy R Pierce
(74) *Attorney, Agent, or Firm* — Kenneth H. Sonnenfeld; Tiffany Weksberg

(57) ABSTRACT

A transparent conductive electrode comprising metal nanowires and method of making is described, wherein the transparent conductive electrode has a pencil hardness more than 1H, nanoporous surface having pore sizes less than 25 nm and surface roughness less than 50 nm. The transparent conductive electrode further comprises an index matching layer, having a refractive index between 1.1-1.5 and a thickness between 100-200 nm.

17 Claims, 4 Drawing Sheets

(51) Int. Cl.
*B82Y 30/00* (2011.01)
*B82Y 40/00* (2011.01)

(56) References Cited

U.S. PATENT DOCUMENTS

| | | |
|---|---|---|
| 8,174,667 B2 | 5/2012 | Allemand et al. |
| 8,225,238 B2 | 7/2012 | Wolk et al. |
| 2010/0243295 A1* | 9/2010 | Allemand et al. ............ 174/250 |
| 2013/0170218 A1* | 7/2013 | Wolk et al. .............. 362/296.01 |

* cited by examiner

Prior art

LOW HAZE TRANSPARENT CONDUCTIVE ELECTRODES AND METHOD OF MAKING THE SAME

CROSS-REFERENCE TO RELATED APPLICATION

This application claims the benefit under 35.U.S.C. §119(e) of U.S. Provisional Patent Applications 61/654,408, 61/654,098 and 61/802,496. The subject matter as set forth in each one of the following US utility provisional patent applications is incorporated herein by reference in its entirety:
Ser. No. 61/654,408, filed Jun. 1, 2012;
Ser. No. 61/654,098, filed Jun. 1, 2012; and
Ser. No. 61/802,496, filed Mar. 16, 2013.

BACKGROUND

1. Technical Field

This disclosure is related to low-haze transparent conductive electrodes (Herein after "TCE"), and method for making the same.

2. Description of the Related Art

Transparent conductive electrodes are optically clear and electrically conductive films, comprising substrates and transparent conductive materials deposited on top of the substrates. The substrates can either be glass or plastic. The transparent conductive materials currently used in the art, are indium tin-oxide (ITO), aluminum doped zinc oxide (AZO), fluorine doped tin oxide (FTO), carbon nanotubes, graphenes, or metal nanowires.

Many commercial applications of transparent conductive electrodes, such as display applications, typically require both excellent optical properties, for example, high optical transmittance and low haze, and superior electrical properties, i.e. high conductivities or low sheet resistance. Most of the research effort in the field has been working towards how to balance the optical properties and electrical properties, as most of development has been found to improve one property at the sacrifice of the other.

In addition to electrical and optical properties of transparent conductive electrodes, physical or mechanical properties of the film, such as film hardness, are also important. It is well known that film hardness of a transparent conductive film is directly related to the production yield of the electronic devices. For example, when using metal nanowire based transparent conductive electrode to make touch screen device in a manufacturing scale, one of the significant factors contributing to the yield loss is the scratching or denting of the film in the manufacturing processes. However, most of the metal nanowire based transparent conductive electrodes in the prior art, for example, the transparent conductive electrode taught in U.S. Pat. No. 8,018,568, have metal nanowires embedded in a polymer matrix, such as polyurethane or acrylate polymers. The polymer matrix generally does not offer enough scratch, scuff or abrasion resistance.

In view of the foregoing, a harder metal nanowire based TCE film is needed. Here we present a low haze metal nanowire based conductive film that not only has excellent electrical properties but an optimized portfolio of optical and mechanical properties as well.

SUMMARY OF THE INVENTION

The present invention discloses low haze transparent conductive electrodes as films having excellent electrical, optical and mechanical properties, suitable for touch screen device manufacturing.

Described herein are transparent conductive electrodes having a haze of less than 2%, more typically, less than 1%, while maintaining high electrical conductivities (e.g., less than 100 ohms/square), or more preferably less than 60 ohms/square.

In one embodiment a transparent conductive electrode having a haze of less than 2%, more typically, less than 1%, while maintain a light transmission of over 90% in the visible light range.

In another embodiment a transparent conductive electrode having a pencil hardness of more than 1H, more typically 3H, while maintaining high electrical conductivities (e.g., less than 100 ohms/square), or more preferably less than 60 ohms/square.

In another embodiment a transparent conductive electrode having a pencil hardness of more than 1H, more typically 3H, where maintaining a light transmittance of more than 90%.

In another embodiment a transparent conductive electrode having a pencil hardness of more than 1H, more typically 3H, while maintaining a haze of less than 2%, more typically, less than 1%, and methods of making the same.

In another embodiment a transparent conductive electrode having a surface roughness <2 Ra or 50 nm, high electrical conductivities (e.g., less than 100 ohms/square), or more preferably less than 60 ohms/square.

In another embodiment a transparent conductive electrode having a surface roughness <2 Ra or 50 nm, where maintaining a light transmittance of more than 90%.

In another embodiment a transparent conductive electrode having a surface roughness <2 Ra or 50 nm, while maintaining a haze of less than 2%, more typically, less than 1%, and methods of making the same.

In another embodiment a transparent conductive electrode having nanoporous surface having pore size less than 25 nm, high electrical conductivities (e.g., less than 100 ohms/square), or more preferably less than 60 ohms/square.

In another embodiment a transparent conductive electrode having nanoporous surface having pore size less than 25 nm, where maintaining a light transmittance of more than 90%.

In another embodiment a transparent conductive electrode having nanoporous surface having pore size less than 25 nm, while maintaining a haze of less than 2%, more typically, less than 1%, and methods of making the same.

In a further embodiment a transparent conductive electrode having a haze of less than 1.5%, more typically, less than 0.5%, comprises a substrate and a index matching layer, wherein the refractive index of the material in the index matching layer is between 1.1 to 1.5.

In a further embodiment a transparent conductive electrode having a haze of less than 2%, more typically, less than 1%, comprises a substrate and a index matching layer, wherein the thickness of the materials in the index matching layer is about 100-200 nm.

In still a further embodiment of the present invention, a method of making a conductive electrode film, comprising:
synthesizing and purifying metal nanowires;
suspending purified metal nanowires in a binder free solvent to form dispersion;
coating a thin layer of metal nanowire above a substrate;
heating the substrate with coated layer of nanowire at a temperature 55-150° C. to remove the solvent;
applying a layer of sol-gel solution comprising an index matching material above the substrate; and annealing the film at a temperature between 55-150° C. and releasing the residual solvent and stress in the film.

BRIEF DESCRIPTION OF THE DRAWINGS

Exemplary embodiments of the disclosure will be more clearly understood from the following detailed description taken in conjunction with the accompanying drawings in which.

DETAILED DESCRIPTION OF SELECTED EXAMPLES

Hereinafter, selected examples of a transparent conductive electrode will be discussed in the following with reference to the accompanying drawings. It will be appreciated by those skilled in the art that the following discussion is for demonstration purposes, and should not be interpreted as a limitation. Other variances within the scope of this disclosure are also applicable.

"Optional" or "optionally" means that the subsequently described circumstance may or may not occur, so that the description includes instances where the circumstance occurs and instances where it does not.

"Above" means one layer is located on top of another layer. In one example, it means one layer is situated directly on top of another layer. In another example, it means one layer is situated over the second layer with more layers or spacers in between.

It is understood that by those skilled in the art when a number of metal nanowires intersecting with each other, they form a network structure. Terms like "metal nanowire network", "metal nano mesh" or "metal nano web" can be used interchangeably and refer to the same object.

Figure 1:
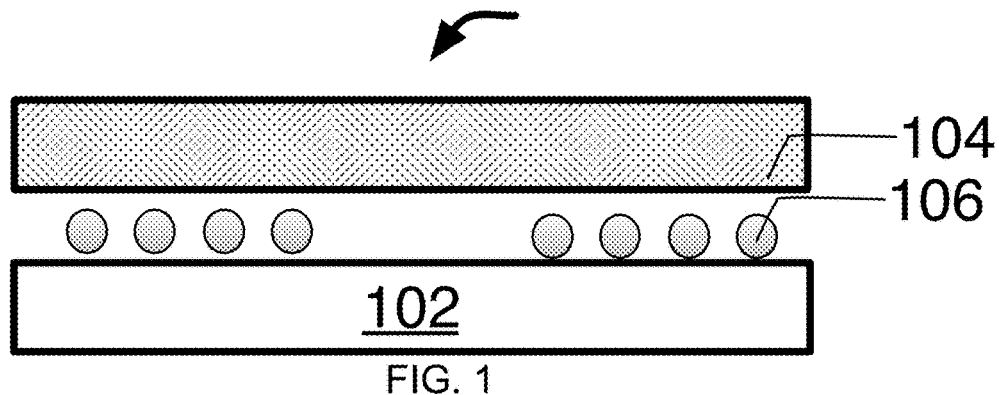
FIG. 1 diagrammatically illustrates a cross-section view of the transparent electrode in the prior art.

FIG. 1 diagrammatically illustrates a cross-section view of the transparent electrode in the prior art. The electrode in the prior art (98) comprises a substrate 102, an isotropic matrix layer (104) on top of the substrate 102 and a layer of metal nanowire (106). The isotropic matrix layer (104) usually acts as a protective blanket on top of the metal nanowire layer.

The present invention discloses low haze transparent conductive electrodes with both excellent electrical properties, optical properties and mechanical properties. Optical properties include haze and transmittance of the film, which can be measured directly from the samples. Optical properties also include film properties that indirectly impact the optical appearance of the film, such as the surface roughness, film or layer thickness and other surface feature of the film. Mechanical properties include physical properties of the film such as hardness, adhesion strength.

The present invention discloses, in one aspect, a transparent conductive electrode film, having a sheet resistance less than 350Ω/□. In one example, the transparent conductive electrode has a sheet resistance less than 100Ω/□. In another example, the transparent conductive electrode has a sheet resistance less than 50Ω/□.

The present invention discloses, in another aspect, a transparent conductive electrode film, having an optical transmittance more than 80% in the wavelength between 400-1000 nm. In one example, the transparent conductive electrode has an optical transmittance more than 80% in the wavelength between 400-800 nm. In a more preferred example, the transparent conductive electrode has an optical transmittance more than 90% in the wavelength between 400-800 nm.

The present invention discloses, in another aspect, a transparent conductive electrode film, having a haze value less than 2%. In one example, the transparent conductive electrode has a haze value less than 1%. In another example, the transparent conductive electrode has a haze value less than 0.5%.

The present invention discloses, in a particular aspect, a transparent conductive electrode film having a pencil hardness of more than 1H. In a more preferred example, transparent conductive electrode film has a pencil hardness of more than 3H.

The present invention discloses, in one aspect, a transparent conductive electrode film having a surface roughness less than 25 nm.

The present invention discloses, in a special aspect, a transparent conductive electrode film having a nanoporous surface with pore size less than 25 nm.

The present invention discloses a low haze transparent conductive electrode film comprising an index matching layer, is comprised of materials with refractive indexes between 1.1-1.5.

The present invention discloses a low haze transparent conductive electrode film comprising an index matching layer having a thickness of between 100-200 nm.

The present invention discloses a low haze transparent conductive electrode film comprises metal nanowires at least 50-100μ in length and less than 50 nm in diameters.

Index Matching Multilayer

Figure 2:
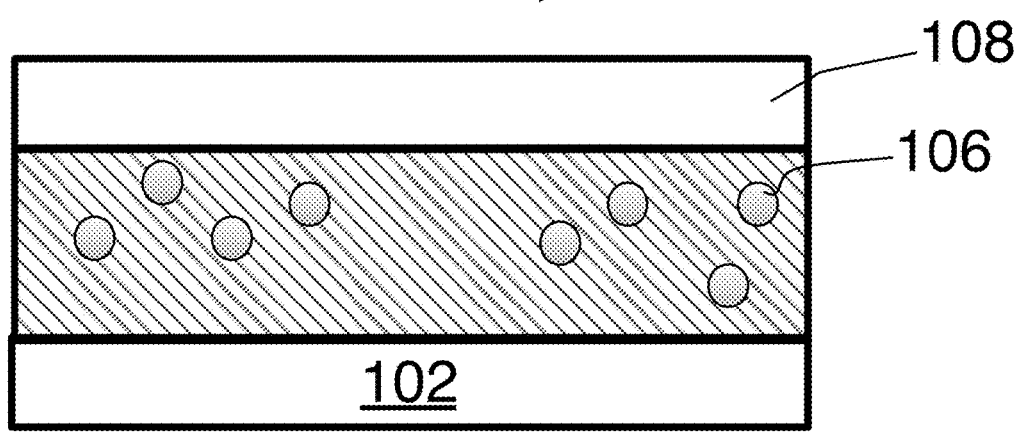
FIG. 2 diagrammatically illustrates a cross-sectional view of an exemplary transparent conductive electrode in the present invention.

Referring to FIG. 2, in one embodiment, the low haze transparent electrode (100) in the present invention comprises a substrate (102), and a substantially a single layer of conductive material deposited on top of the substrate. The single layer conductive material comprises one or more metal nanowires (106). Optionally, the single layer conductive material further comprises an anisotropic layer of metal oxide. The anisotropic layer of metal oxide can be metal oxide material 104, like ITO or can be a different conductive material, such as FTO, AZO. The anisotropic layer can also be a semi-conductive layer based on metal oxides, conductive polymers, carbon nanotubes or graphenes.

In one example of the present invention, the low haze transparent conductive electrode comprises an index-matching layer (108). The index-matching layer can be an isotropic layer with a refractive index in between the refractive index of the substrate and that of the working environment of the transparent conductive electrode. In one instance of the present invention, glass is used as the substrate, having a refractive index of n_glass, and air as the working environment of the electrode (i.e. incoming media of the light), having a refractive index of n_air, the ideal refractive index of the matching layer should be a square root of (n_glass*n_air).

Optionally, the layer thickness of the index-matching layer (108) is preferably optimized to be around one quarter of wavelength of light. Said wavelength of light is preferably to be a specific target wavelength. In one preferred example of the present invention, the thickness of the index-matching layer is designed that the overall appearance of the color of the electrode viewing from the bottom substrate matching to the substrate and the contrast between the patterned areas covered by metal nanowires (106) and unpatented area is minimal. By doing so, the index matching layer (108) reduce the reflection/light scattering from metal nanowire (106) surface, which tend to give a hazy appearance. Optionally, additional layers of index-matching layer could be coated on top to further reduce the hazy appearance.

The material in the index-matching layer can be conductive materials, or semi-conductive materials, or nonconductive materials. The conductive materials includes metal oxides such as ITO, FTO, AZO, and polymers such as PEDOT; semi-conductive materials includes zinc oxides, titanium oxides, tin oxides; and nonconductive materials includes silicon dioxides, silicates, polyurethane, PMMA, PVA and silicones.

Figure 3:
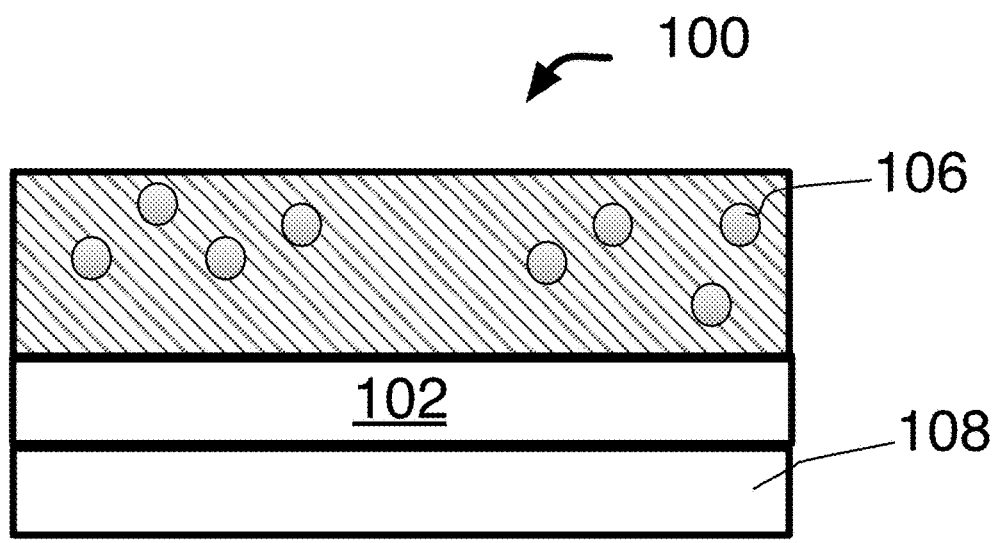
FIG. 3 diagrammatically illustrates a cross-sectional view of an exemplary transparent conductive electrode in the present invention.

In the index-matching layer (108) is situated on top of the nanowire layer (106) as shown in FIG. 2. But in another example of the present invention, as shown in FIG. 3, the index-matching layer is situated on the bottom surface of the substrate glass.

Index Match Single Layer

Figure 4:
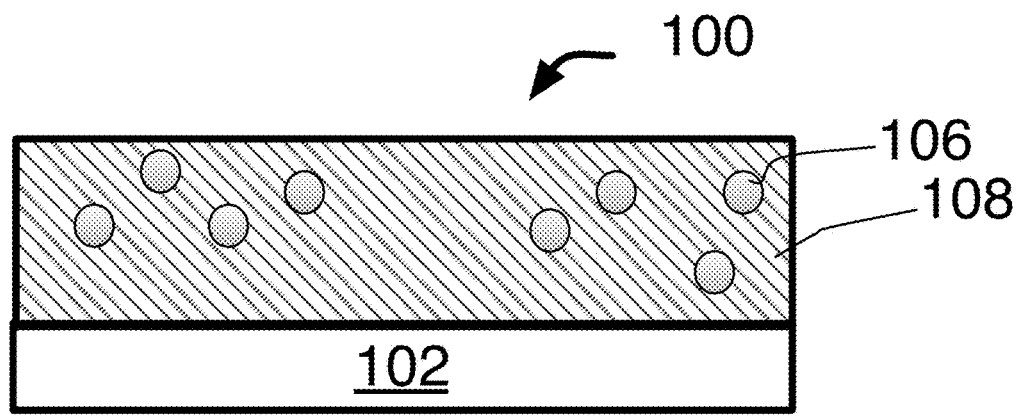
FIG. 4 diagrammatically illustrates a cross-sectional view of another exemplary transparent conductive electrode in the present invention.

Referring to FIG. 4, in another embodiment of the present invention, the low haze transparent electrode (100) in the present invention comprises a substrate (102), and a substantially a single layer of conductive material deposited on top of the substrate. The single layer conductive material comprises one or more metal nanowires (106) and an index matching material layer, wherein the index material layer is substantially the same layer of the layer comprising metal wires and no interface between the metal nanowires and the index matching materials.

The substantial single layer conductive film is made by first coating a thin layer of metal nanowire dispersion onto a surface of a substrate. After heating to remove solvent, a layer of sol-gel solution comprising index matching material was applied on top of baked sample by a wet coating process. The resulted sample was further baked to remove solvent and anneal. In the finished transparent conductive film, made by the process described herein, comprises a substrate with a connected metal nanowire network buried or embedded in closely packed particles of the index matching material.

Table 1 in the example section summarizes a portfolio optical properties of samples as substrate, nanowire bearing substrate and nanowire bearing substrate along with index match layer. The comparison between nanowire bearing substrate and nanowire bearing substrate along with index match layer has clearly set forth the additional index matching layer or material significantly improved overall optical performance of the conductive film.

In one example of the present invention, the low haze transparent conductive electrode comprises an index-matching layer (108). The index-matching layer can be an isotropic layer with a refractive index in between the refractive index of the substrate and that of the working environment of the transparent conductive electrode. In one instance of the present invention, glass is used as the substrate, having a refractive index of n_glass, and air as the working environment of the electrode (i.e. incoming media of the light), having a refractive index of n_air, the ideal refractive index of the matching layer should be a square root of (n_glass*n_air).

Optionally, the layer thickness of the index-matching layer (108) is preferably optimized to be around one quarter of wavelength of light. Said wavelength of light is preferably to be a specific target wavelength. In one preferred example of the present invention, the thickness of the index-matching layer is designed that the overall appearance of the color of the electrode viewing from the bottom substrate matching to the substrate and the contrast between the patterned areas covered by metal nanowires (106) and unpatterned area is minimal. By doing so, the index matching layer (108) reduce the reflection/light scattering from metal nanowire (106) surface, which tend to give a hazy appearance. Optionally, additional layers of index-matching layer could be coated on top to further reduce the hazy appearance.

The material in the index-matching layer can be conductive materials, or semi-conductive materials, or non-conductive materials. The conductive materials includes metal oxides such as ITO, FTO, AZO, and polymers such as PEDOT; semi-conductive materials includes zinc oxides, titanium oxides, tin oxides; and nonconductive materials includes silicon dioxides, silicates, polyurethane, PMMA, PVA and silicones.

In one example, the metal nanowire is silver metal nanowire. And the index matching material is silica. The silica sol-gel solution is spun coated on to a PET substrate.

It must be noted that spin coating is used as depositing technique for silver nanowire and the silica index matching layer in a lab. However, other coating technique such as dip coating, gravure coating, slot die coating may also be used in either small scale fabrication or large scale manufacturing.

In addition, other than the wet coating method to place the index matching material on top of or above the substrate, convention sputtering technique can be used when it is appropriate.

It must be noted that the silica oxide can also be replaced by other materials, such as ITO, FTO, and these metal oxides can be introduced to the surface of the substrate or metal nanowire either by a sol-gel process or film by sputtering.

In one preferred example, the thickness of index matching layer is about 100-200 nm. In one instance, the final thickness of the layer is determined or controlled by the concentration of the solution comprising index matching materials, such as silica sol-gel solution. In another instance, the wet film thickness of the index matching layer is determined by the coating process. For example, the coating process including spin speed etc if index matching layer is deposited using spin coating.

It must be further noted that the refractive index of the index matching layer can be tuned by silica colloidal particle size. Preferred refractive index should be in the range of 1.1 to 1.5 which is governed by square root of n_air*n_substrate. For example, when PET is used, n_sub is 1.58, the refractive index for the index matching layer is 1.25. In another example, the substrate is a glass, the refractive index of the index matching layer is 1.22.

Surface Roughness

In particular aspect of the present invention, the surface roughness of the low haze index matched TCE is less than 1Ra. Conventionally prepared metal nanowire transparent conductive electrode film usually comprise two or more wires overlapping each other; and the surface roughness is usually in the order of the nanowire diameter, which are typically more than 2Ra. As a result, rougher surface led to higher haze due to more light scattering on the surface.

Nanoporous

Figure 5:
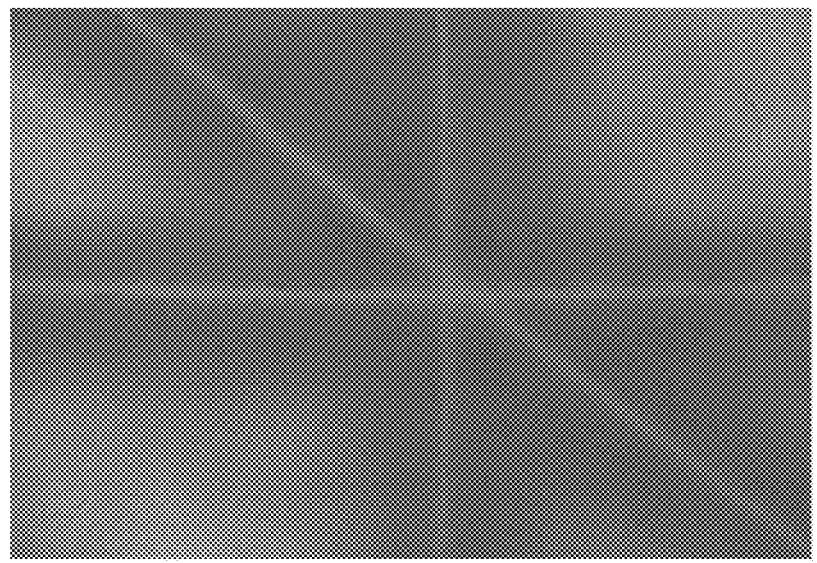
FIG. 5 is a SEM picture showing nanowires embedded in nanoporous index matching layer.
Figure 6:
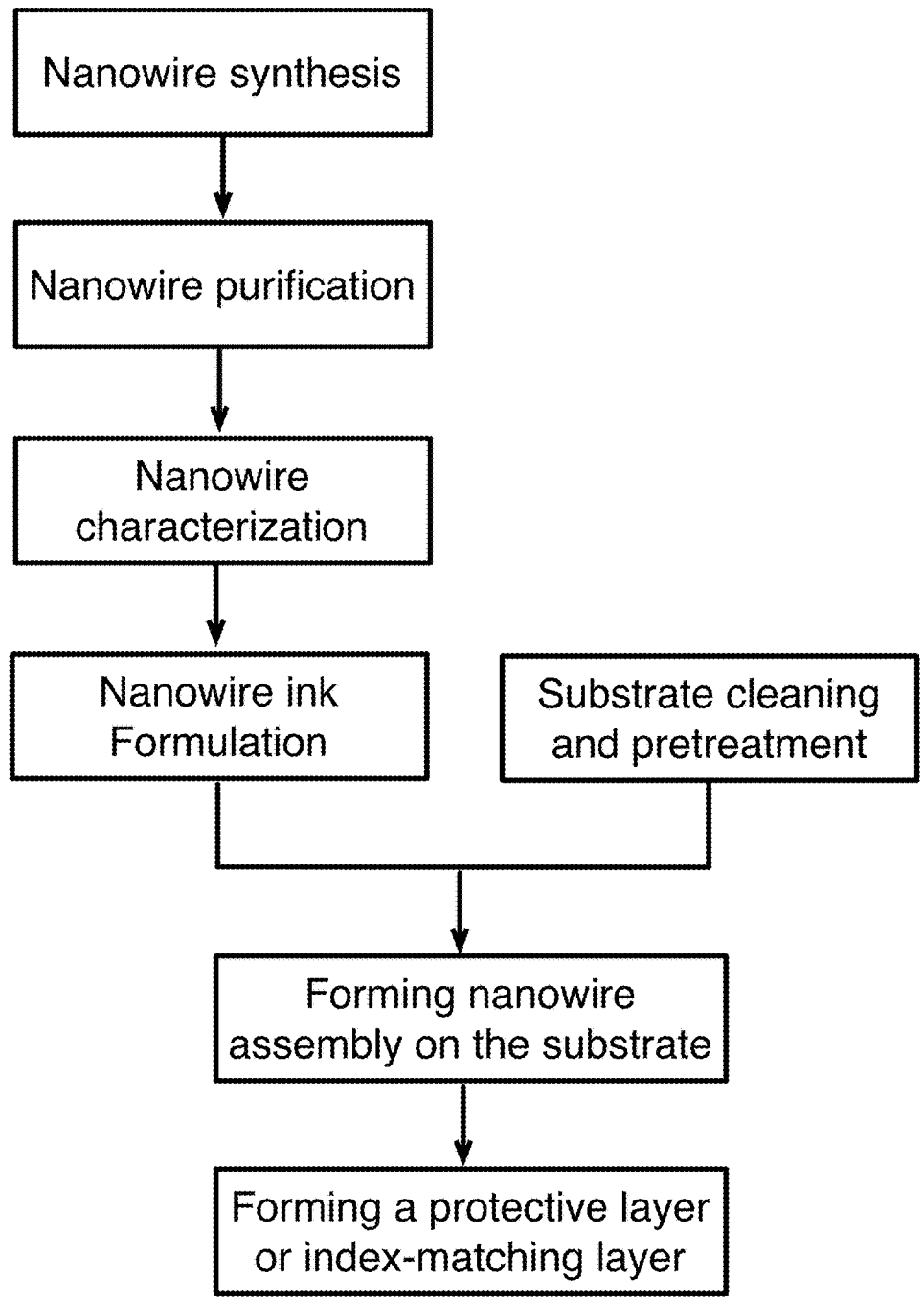
FIG. 6 is process flow diagram of an exemplary method to make transparent conductive electrode.

In another particular aspect of the present invention, a novel feature in the low haze transparent conductive electrode described herein, is the nanoporous surface nature. FIG. 5 is a SEM picture showing nanowires embedded in nanoporous index matching layer. Nanoporous surface offers significant advantages. One benefit associated with this is extremely low electrical contact resistance due to high surface contact area. Another benefit is improved adhesion to adhesive and other bonding materials. One benefit associated with this is extremely low electrical contact resistance due to high surface contact area. Another benefit is improved adhesion to adhesive and other bonding materials.

|  | Contact Resistance |
|---|---|
| Commercial TCE (ITO) | 24.6 |
| Our TCE | 9.7 |

In a preferred example, the transparent conductive electrode in the present invention, has a nanoporous surface with pore size less than 25 nm.

Hardness

In a further aspect of the present invention, the transparent conductive electrode has a pencil hardness of more than 1H, which is critical for touch screen manufacturing.

Table 3 summarizes a comparison of pencil hardness among different samples. A set of pencils ranging from 2B to 4H are used for pencil hardness testing. Conventional transparent conductive electrode which do not have index matching layer, are failed at 2H or blew 2H. The samples having index matching layer or index matching materials all survived 4H pencil test.

TABLE 3

A comparison of pencil hardness among different samples
S: bare substrate; S + N: bare substrate having metal
nanowire network; S + N + I: bare substrate having
metal nanowire network, with additional index matching layer)

|  | Hardness |
|---|---|
| S | B |
| S + N | <2H |
| S + N + I | >4H |

Synthesis of Nanowires of High Aspect Ratios

The present invention discloses low haze transparent conductive electrodes with both excellent optical properties, electrical properties and mechanical properties. The low haze transparent conductive electrodes disclosed herein have an optical transmittance higher than 90%, a haze value less than 2%, and typically less than 1%, while maintaining the sheet resistance lower than 100 Ohms/sq and typically less than 50 Ohms/sq.

The low haze transparent electrode in the present invention comprises a substrate, and a substantially single layer of conductive material deposited on top of the substrate. The single layer conductive material comprises one or more metal nanowires. The haze value less than 2% is achieved by utilizing metal nanowires which are longer and thinner than conventional metal nanowires.

Optionally, the single layer conductive material further comprises an anisotropic layer of metal oxide, metal nitrides, or semiconductive oxides.

Surface Roughness

In one embodiment of the present invention, the single layer of conductive material with anisotropic layer of metal oxide or non-metallic oxide have average surface roughness <10 nm. Current commercially available metal nanowire based conductive layer have roughness >20 nm, and typically over 50 nm. The rougher the surface, the higher the haze due to light scattering from uneven surface textures.

In one embodiment of the present invention, the low haze transparent conductive electrode comprises nanowires having a longer than usual length and thinner than usual diameters. Said nanowires are at least 20-100μ in length and less than 50 nm in diameters. The longer the nanowire in length, the better the conductivity due to fewer contact junctions. The smaller the nanowire diameters, the less pronounced light scattering/reflection observed from the nanowires, leading to an appearance with reduced haze.

In another embodiment of the present invention, a method of making of longer than usual length and thinner than usual diameter nanowires is disclosed. The method comprises a proceeding step, forming most of the nanowire nucleation seeds and a growing step where the nucleation seeds grow preferentially in one dimension in a controlled manner.

Per Long and Thin Nanowires Details

In one embodiment of the present invention, the low haze transparent conductive electrode comprises nanowires having a longer than usual length and thinner than usual diameters. The usual length is defined as about 10-30 micrometers in length and the usual diameters are defined as about 80-100 nm in diameters in the scope of the present invention.

Transparent conductive electrodes in the art typically employing metal nanowires having diameters around 80-100 nm, with 20-30 micrometers in length. The low haze transparent conductive electrodes disclosed in the present invention, comprises metal nanowires are less than 50 nm in diameters and longer than about 20-100 micrometers. In one preferred example of the present invention, the low haze transparent conductive electrode comprises nanowires having less than 30 nm in diameters. The longer and thinner metal nanowires significantly reduces the amount of light scattering and the contrast between the areas having nanowires and the areas without, leading to a conductive electrode with lower haze. In addition, the longer than usual nanowires further facilitates the electron transport within the electrode, leading to improved electrical conductivity and reduced sheet resistance. In the examples of the present invention, the low haze transparent electrode comprising metal nanowires having less than 50 nm in diameters and 20-100 micrometers in length, have an optical transmittance higher than 90%, a haze value less than 0.6%, while maintaining the sheet resistance lower than 50 Ohms/sq.

In another embodiment of the present invention, a method to make the unusual long and unusual thin metal nanowires is disclosed herein. Apart from the conventional one step process of making metal nanowires in the art, which typically lead to metal nanowires 80-100 nm in diameters and 20-30 micrometers in length, the method disclosed in the present invention comprises a two-step process. A first step is a proceeding step, forming most of the nanowire nucleation seeds. A second step is a growing step, where the nucleation seeds grow preferentially in one dimension in a controlled manner. Further, the nucleation seeds can be purified before being used in the growing step. Subsequently, the metal nanowires collected after the growing step can be further purified to have nanowires with even narrower distribution in length and diameters. Comparing the conventional one step method, the two-step process has two advantages. First, the proceeding step incubates the formation of the nucleation seed, which significantly reduces the concentration of the nanowire "growing centers". Second, the growing step is conditioned that the precursors are continuously growing in one predetermined direction in length, thus reducing the formation of junctions and branches in the metal nanowire network.

Once the desired metal nanowires have been prepared, a transparent conductive electrode can be made through a printing, coating process or electro-spinning process to lie down into a nanowire film.

In still another embodiment of the present invention, the low haze transparent conductive electrode further comprises an index matching film between the substrate and nanowire layer. The index matching film comprises conductive material, semi-conductive materials or nonconductive materials as described herein in other embodiments and/or examples.

In still another embodiment of the present invention, the low haze conductive electrode further comprises a protective index matching film on top of the conductive layer and the substrate. The protective film has a refractive index between the substrate and air. The protective film comprises conductive material, semi-conductive materials or nonconductive materials.

The present invention is directed to a method of manufacturing metal nanowires, which are especially the unusually long and thin metal nanowires, having aspect ratio at least 500:1.

As used herein, the phrase "aspect ratio" designates that ratio which characterizes the average nanowire size or length divided by the average nanowire thickness or diameter. In one exemplary embodiment, the metal nanowire is a silver nanowire, having an aspect ratio of 500:1. The metal nanowires contemplated herein have high aspect ratios, such as 500:1 or higher. A 1000:1 aspect ratio may be calculated, for example, by utilizing nanowires that are 60 microns by 60 nm. Aspect ratios higher than 1000:1 can be calculated from nanowires having lengths longer than 50 microns and diameters 50 nm or less.

Synthesis of Super Metal Nanowires

The method of synthesizing the metal nano wires having high aspect ratios, disclosed herein, comprises the steps of:
heating a solvent at 100-150 degree C.;
adding a controlled amount of nucleating precursor at a controlled speed to the solvent;
adding the metal salts into the heated mixture;
reducing metal ions dissociated from the metal salts into metal by redox reaction in the solvent;
heating the reaction mixture to allow the reaction to proceed for 4-8 hours;
adding additional metal ions at a controlled rate to maintain the desired ionic concentration; and
quenching the redox reaction with cold water.

In one aspect of the present invention, the metal nanowire includes silver nanowire, gold nanowire and any other metal nanowires made of noble elements.

In another aspect of the present invention, the solvent described in the method is a liquid that is capable of generating a small amount of a redox agent when heated, is not particularly limited and may be suitably selected according to the intended purpose. Examples thereof include alcohols such as propanol, isopropanol; diols such as ethylene glycol, propylene glycol, diethylene glycol, triethylene glycol, butanediol, and tri-ols such as glycerol, polyethylene glycol. These solvents may be used alone or in combination. Preferably, ethylene glycol is used as a solvent, at >99% purity. Examples of glycols include the ACS reagent grades that are available from commercial sources.

In still another aspect of the present invention, the nucleating precursor described in the above method includes chemicals that can effectively facilitate the formation of the metal nanowire, particularly silver nanowire, when silver is reduced from silver ion to silver metal. Using nucleating precursors can assist the formation of nucleating centers and direct the growth of silver nanowire in a preferred orientation, thereby providing unusually long and thin silver nanowires, which in turn will improve the conductivity and reduce the haze of the conductive film and transparent conductive electrode formed from them. Many different chemical compositions are known for this purpose. In accordance with the aspects of the present invention, examples of the nucleating precursors include, but are not limited to, polyvinylpyrrolidone (PVP), polyvinyl alcohol (PVA), polyethylene oxide (PEO) etc. Other examples of the nucleating precursors can be found in US patent publication 2009/0196788 A1.

Besides choosing an appropriate nucleating agent for the above method, in order to optimize silver nanowire growth to make unusually long and thin silver nanowires, adding a controlled amount of nucleating precursor at a controlled speed is critical too. The ability of the nucleating agent in a solvent, the amount of it at a given time, and the concentration of the silver metal ions are important factors that determine the lengths and diameters of the resultant silver nanowire.

In yet another aspect of the present invention, the method of synthesizing the metal nanowire described in the present invention includes controlling multi-stage of the reaction to allow the independent control of wire diameter and wire length. The first stage is primarily directed to control the nanowire diameter whereas the second stage is primarily directed to grow the wire length without significant changing the wire diameter; typically the growth stage continues for 2-4 hours and can be extended further if longer nanowires are needed. In one example we synthesize wires with diameter of 30 nm and length of 15 um during first stage. It then proceed into second stage and the wires formed in the first stage serve as nucleating seeds. Newly reduced silver atoms continue to deposit on both ends of nanowire extending its length without making the wire thicker. At the end of 2 hours, nanowire dimension become ~25 um long and 30 nm thick.

It is further noted that in the second stage the addition of metal ions must be controlled at a much slower rate to maintain the desired ionic concentration. If the salt is added all at the beginning, then the final reaction mixture contains a mixture of particles with other shapes (nanocubes and low aspect ratio (<100) nanowires/nanorods), in addition to the desired high aspect ratio nanowires.

The metal salt can be used to make metal nanowires is not particularly limited and may be suitably selected according to the intended purpose. Examples thereof include nitrate salts, halide salts, phosphoric salts, sulfate salts, tetrafluoroborates, amine complexes, chloro complexes, and organic acid salts. Among these, nitrate salts, tetrafluoroborates, amine complexes, chloro complexes and organic acid salts are particularly preferred, since these show high solubility in polar solvents. Silver ion concentration may also be further controlled by precipitating silver ions with halides/hydroxide/sulfate ions to form insoluble silver salts that readily dissociates in the polar solvent at an equilibrium solubility product.

The reduction reaction by the addition of a solution of a metal salt proceeds even at room temperature, but is preferably performed while heating a solution containing silver nanowires and a metal salt or a solution of a metal salt. Heating of the solution promotes the reduction of the metal salt to silver as well as controls the phase morphology of reduced silver. Optionally, addition of a reducing agent, or chemical reduction method may further be used in combination with the heating selected according to the intended purpose.

Heating a solution can be performed by means of, for example, an oil bath, aluminum block heater, hot plate, oven, infrared heater, heat roller, steam (hot air), ultrasonic wave, or microwave. The heating temperature is preferably 80 C. to 200.degree. C., and more preferably 100.degree. C. to 150.degree. C.

It is further noted that in the step of the addition of metal ions, the metal ions must be controlled at a much slower rate (typically one tenth of the first stage addition rate, in the range of 0.1 ml/min-1 ml/min or at a rate of <1% of total reaction volume/min) to maintain the desired ionic concentration, which in turn determines the length of the nanowire. If the salt is added all at the beginning, then the final reaction mixture contains a mix of particles with other shapes (nanocubes and low aspect ratio (<100) nanowires/nanorods), in addition to the desired high aspect ratio nanowires. The addition rate must be such that the aspect ratio of the resultant product is >500:1.

Nanowire Purification

Further, the present invention is directed to a method of purifying the transparent conductive electrode. The purification method comprises a step of filtering the nanowire solution using a filtration apparatus having a moving contact surface. The filtration apparatus can be a funnel, or a rotation device. Optionally, the filtration step is performed under pressure, with/without heating.

The present invention is also directed to a method of making the transparent conductive electrode comprising:
synthesizing the nanowires;
purifying the nanowires using pressure or under atmosphere;
formulating nanowires dispersion using a solvent;
cleaning the pre-treated the substrate; and
coating a layer of index-matching coating or a protective coating onto the substrate.

After the nanowires having an aspect ratio higher than 500:1 are synthesized and purified, a nanowire dispersion is formulated in order to fabricate a conductive electrode. In one exemplary embodiment of the invention, the silver nanowires comprise about 0.01% to about 4% by weight of the total dispersion. In a preferred embodiment of the invention, the silver nanowires comprise about 0.1 to about 0.6% by weight of the dispersion.

Solvents suitable for preparation in the dispersion comprise any suitable pure fluid or mixture of fluids that is capable of forming a dispersion with the metal nanowires and that may be volatilized at a desired temperature. In addition, the solvent is desired to provide good quality nanowire film and can be obtained high purity (>99%) at a relatively low cost. In some examples, solvents used for the dispersion have a boiling point of less than about 250° C. In other examples, solvents used for the dispersion have a boiling point in the range of from about 50° C. to about 250° C. Solvents for the dispersion also include any mixture of organic solvents.

Optionally, additives or additional solvents can be added to nanowire dispersion to improve the overall performance of the electrode. Such additives include additives to improve film morphology, reduce the drying time, and improve adhesion to other layers in the electrode.

Experimental

Example 1

Preparation of an Index Matched Low Haze Transparent Conductive Film

Silver nanowires (25 um, 60 nm) were first prepared by polyol process and followed by purification. Then 0.15 g of purified nanowires was dispersed in a 50 ml of binder free solvent such as ethanol or methanol or IPA to prepare a 0.3% w/v of silver nanowire dispersion. On a PET substrate, a thin layer of SNW dispersion is spun coated at 1500 rpm spin speed for 30 s. The coated substrate was baked at 100 C for 1 minute. A layer of 1.8% wt silica sol-gel solution was applied on top of baked sample by spin coating at 2500 rpm for 10 s. The resulted sample was further baked at 100 C for 1 minute.

The final sample comprises a PET substrate with a connected silver nanowire network buried or embedded in closely packed silica particles.

Example 2

Comparison of Optical Properties

Table 1 lists a comparison of transmittance and haze values between transparent conductive films with or without index matching layer. Data on transmittance, haze and transmittance are summarized for a first sample having only a substrate, a second sample having a substrate with nanowires and a third sample having nanowire bearing substrate with an index matching layer. Comparing the results from the second and third sample, data in Table 1 clearly established that the extra index matching layer improves the transmittance, reduces haze and offers a film having less surface roughness.

TABLE 1

Summary of optical properties and surface roughness data
(S: bare substrate; S + N: bare substrate having metal
nanowire network; S + N + I: bare substrate having
metal nanowire network, with additional index matching layer)

| Sample name | Transmittance | Haze | Roughness |
|---|---|---|---|
| S | 90% | 0.6% | <1Ra |
| S + N | 89.8% | 1.7% | 2Ra |
| S + N + I | 91.6% | 1.5% | <1Ra |

Example 3

Nanowire Synthesis and Post Synthesis Characterization

Nanowires were synthesized by the known literature techniques then followed by suitable purification procedures using pressure and filtration. Then the purified nanowires were subsequently characterized by optical microscopy for their length and by SEM for their diameters. Optionally, the nanowires synthesized were further casted into a nanowire film to a piece of substrate to test for haze values before being assembled into an electrode.

In a first example, 5.1 g of PVP is first dissolved in 50 mL of glycerol solvent and heated to 150 C. In the meantime, 5.1 g of silver nitrate is separately dissolved in 30 ml of glycerol to form a silver nitrate solution. Then, the silver nitrate solution is added to the PVP solution at a constant rate of 2 ml/min for 9 minutes; this is then followed by adding the remaining portion of silver nitrate solution at 0.4 ml/min for another 30 minutes. The reaction is allowed to proceed for another 3 hours before it is quenched by mixing equal volume of cold water (20 C). The final mixture was then solvent exchanged by repeated centrifuge and re-dispersion in desired solvents. Choices of solvent for the centrifuge/re-dispersion processes are determined by the desired dispersing medium for nanowire in ink formulation, e.g. water or ethanol. Typical amount of solvent used in re-dispersion is about 50× or more of the remaining solid collected by centrifuged. The whole process is repeated at least 3 times. The process conditions can be scaled to large volume as illustrated in the example below.

In the second example, 51 g of PVP is first dissolved in 500 mL of glycerol solvent and heated to 150 C. In the meantime, 51 g of silver nitrate is dissolved in 300 ml of glycerol separately to form silver nitrate solution. Then, the silver nitrate solution is added to the PVP solution at a constant rate of 20 ml/min for 9 minutes; this is then followed by adding the remaining portion of silver nitrate solution at 4 ml/min for another 30 minutes. The reaction is allowed to proceed for another 3 hours before it is quenched by mixing equal volume of cold water (20 C). The reaction mixture was then solvent exchanged by repeated centrifuge and re-dispersion in desired solvents. Choices of solvent for the centrifuge/re-dispersion processes is determined by the desired dispersing medium for nanowire in ink formulation, e.g. water or ethanol. Typical amount of solvent used in re-dispersion is about 50× or more of the remaining solid collected by centrifuged. The whole process is repeated at least 3 times.

Although few embodiments of the present invention have been illustrated and described, it would be appreciated by those skilled in the art that changes may be made in these embodiments without departing from the principles and spirit of the invention. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein. As used in this disclosure, the term "preferably" is non-exclusive and means "preferably, but not limited to." Terms in the claims should be given their broadest interpretation consistent with the general inventive concept as set forth in this description.

I claim:

1. A conductive film, comprising:
   a substrate;
   metal nanowires in a network, deposited above the substrate; and
   an isotropic layer comprising organic or inorganic materials, situated above the substrate,
   an index matching layer in direct contact with the metal nanowires, wherein
   the metal nanowire network is embedded in the isotropic layer, and said conductive film has a nanoporous surface, characterized in that the nanoporous surface has pore sizes less than 25 nm,
   the index matching layer comprises anisotropic material of metal oxide or non-metallic oxide having an average surface roughness less than 50 nm and a thickness of between 100-200 nm.

2. The conductive film of claim 1, has a pencil hardness more than 1H.

3. The conductive film of claim 1, has a pencil hardness more than 3H.

4. The conductive film of claim 1, having a haze less than 2%.

5. The conductive film of claim 1, having a haze less than 1%.

6. The conductive film of claim 5, wherein the nanowire network comprises
   a nanowire at a first length and a first diameter, and
   a second nanowire at a second length and a second diameter, wherein
   the first length of the first nanowire is about 50-100 micrometers and the second diameter of the second nanowire is less than 50 nm.

7. The conductive film of claim 1, having a light transmittance more than 80% in the wavelength between 200-1000 nm.

8. The conductive film of claim 7, having a light transmittance more than 90% in the wavelength between 400-800 nm.

9. The conductive film of claim 1, having a sheet resistance less than 100 ohms/square.

10. The conductive film of claim 6, wherein the second diameter is less than 30 nm.

11. The conductive film of claim 6, where the second length is about 50-100 micrometers.

12. The conductive film of claim 1, wherein the index-matching layer comprises conductive materials, semi-conductive materials or nonconductive materials.

13. The conductive film of claim 1, wherein the substrate is selected from polyethylene terephthalate (PET), polyethylene naphathalate (PEN), polycarbonate, and cyclo olefin polymer (COP) or copolymer, (COC).

14. The conductive film of claim 1, wherein the index matching layer further comprises conductive or semiconducting metal oxides selected from fluorine doped tin oxide (FTO), indium tin oxide (ITO), aluminum doped zinc oxide (AZO), gallium doped zinc oxide (GZO), and boron doped zinc oxide (BZO).

15. The conductive film of claim 1, wherein the substrate is a glass.

16. A touch screen device comprising:
   a conductive electrode, comprising:
      a substrate;
      metal nanowires in a network, deposited above the substrate; and
      an isotropic layer comprising organic or inorganic materials, situated above the substrate,
      an index matching layer in direct contact with the metal nanowires, wherein
      the metal nanowire network is embedded in the isotropic layer, and said conductive film has a nanoporous surface, characterized in that the nanoporous surface has pore sizes less than 25 nm and average roughness of 10-50 nm,
      the index matching layer comprises anisotropic material of metal oxide or non-metallic oxide having an average surface roughness less than 50 nm and a thickness of between 100-200 nm.

17. The touch screen device of claim 16, wherein the electrode has a pencil toughness of more than 1H.

* * * * *